United States Patent
Yoshizawa et al.

(10) Patent No.: US 7,709,160 B2
(45) Date of Patent: May 4, 2010

(54) METHOD FOR MANUFACTURING ATTENUATED PHASE-SHIFT MASKS AND DEVICES OBTAINED THEREFROM

(75) Inventors: Masaki Yoshizawa, Yorktown Heights, NY (US); Leonardus Leunissen, Hamme-Mille (BE)

(73) Assignees: IMEC, Leuven (BE); Sony Corporation, Tokyo (JP)

( * ) Notice: Subject to any disclaimer, the term of this patent is extended or adjusted under 35 U.S.C. 154(b) by 485 days.

(21) Appl. No.: 11/645,156

(22) Filed: Dec. 22, 2006

(65) Prior Publication Data

US 2007/0178392 A1      Aug. 2, 2007

(30) Foreign Application Priority Data

Dec. 27, 2005     (EP)   ................. 05077992

(51) Int. Cl.
*G03F 1/00*    (2006.01)
(52) U.S. Cl. .......................................... 430/5
(58) Field of Classification Search ........ 430/5, 430/394; 716/19, 20, 21; 355/53
See application file for complete search history.

(56) References Cited

U.S. PATENT DOCUMENTS

| | | | |
|---|---|---|---|
| 5,869,212 A | 2/1999 | Hashimoto | |
| 7,180,576 B2 * | 2/2007 | Hansen | 355/67 |
| 2003/0044695 A1 | 3/2003 | Rothschild et al. | |
| 2004/0086788 A1 | 5/2004 | Shiota et al. | |
| 2004/0214096 A1 | 10/2004 | Dulman et al. | |
| 2005/0030502 A1 * | 2/2005 | Fujisawa et al. | 355/53 |
| 2006/0075377 A1 * | 4/2006 | Broeke et al. | 716/19 |

FOREIGN PATENT DOCUMENTS

| | | |
|---|---|---|
| EP | 1 582 920 A2 | 10/2005 |
| JP | 10171094 | 6/1998 |
| WO | WO 2005/090931 A1 | 9/2005 |

OTHER PUBLICATIONS

Kasprowicz et al., "Tunable Transmission Phase Mask Options for 65/45nm Node Gate and Contact Processing," *Optical Microlithography XVIII, Proceedings of SPIE*, vol. 5754, pp. 1469-1477.

* cited by examiner

*Primary Examiner*—Stephen Rosasco
(74) *Attorney, Agent, or Firm*—Knobbe Martens Olson & Bear LLP

(57) ABSTRACT

One inventive aspect relates to an attenuated phase shift mask suitable for hyper NA lithographic processing of a device, to a method of making such a mask and to hyper NA lithographic processing using such a mask. The attenuated phase shift mask is made taking into the effect of the numerical aperture of the lithographic system on which the attenuated phase shift mask is to be used.

19 Claims, 8 Drawing Sheets

METHOD FOR MANUFACTURING ATTENUATED PHASE-SHIFT MASKS AND DEVICES OBTAINED THEREFROM

BACKGROUND OF THE INVENTION

1. Field of the Invention

The present invention relates to methods and systems for lithographic processing of a device, e.g. in electronic device processing especially semiconductor processing. More particularly, the present invention relates to lithographic attenuated phase shift masks, methods of making them and methods of using lithographic attenuated phase shift masks.

2. Description of the Related Technology

Lithographic processing is one of the key features in the manufacturing of today's circuits and integrated components. The quality of the lithographic processing is strongly dependent on the lithographic system and the mask used. Different types of lithographic masks are known such as binary masks, like chrome on glass masks and phase shift masks, such as e.g. alternating aperture phase shift masks (AAPSM) and attenuated phase shift masks (att. PSM). As is the case for binary masks (BIM), alternating phase shift masks consist of a substrate which is transparent for the wavelength of the light used during lithographic processing. On a surface of this transparent substrate, opaque areas are formed which block the propagating of light. However, contrary to binary masks where all light transmitting areas impact the light propagation in a similar intensity and phase, transmitting areas on an alternating phase shift mask are designed to provide an approximately 180° phase difference between light propagating through these transmitting areas and through other transmitting areas on the mask while preserving the intensity of the propagated light. A feature on mask, i.e. on opaque area, is always surrounded by transmitting areas of different phase. The occurrence of the phase difference leads to destructive interference, resulting in a sharp dark image. As is the case for alternating phase shift masks, also for attenuated phase shift masks a 180° phase difference is created between light propagating through different areas on the mask. However in case of an attenuated phase shift, this phase difference is created between a transmitting area and the opaque area. To this extent the material of the opaque area of the binary and alternating phase shift masks is replaced by halftone materials, i.e. a material or stack of materials that is partially transmissive for the wavelength of the light used during lithographic processing. A part of the incident light will be absorbed by the halftone material and a part of the light will be transmitted through the halftone material. FIG. 1 illustrates the orthogonal exposure of a device (200) comprising a substrate (220) covered with a photosensitive layer (210) through an attenuated phase shift mask (100) comprising a transparent substrate (110). On a surface of this transparent substrate (110) transmissive areas (130) and absorbing areas (120) are present. The intensity and phase of the light beams (320) in the absorbing areas (120) is changed with respect to the intensity and phase of the light beams (310) in the transmissive areas (130) as indicated by the respective wave curves showing amplitude (A) as function of time (t). The amount of light propagating through these halftone areas (120) is insufficient to make the photosensitive resist in corresponding areas on the wafer developable. The occurrence of the phase difference between the light with full intensity (330), i.e. propagating through the transmissive areas, and light with reduced intensity and phase shift (340), i.e. propagating through the halftone areas, will lead to destructive interference, resulting in an improved resolution. In FIG. 1 this is illustrated by the reduced and negative amplitude of the light (340) propagating through the halftone film compared with the substantially unaffected positive amplitude of the light (330) propagating through the transmissive areas (130). Such a halftone thin film can be made from bilayer films such as chromium (Cr) and silicon-oxynitride (SiON), tantalum (Ta) and silicon dioxide ($SiO_2$), or of a single layer of molybdenum silicon (MoSi) or molybdenum silicide ($MoSi_2$). These halftone layers should be as thin as possible to reduce manufacturing complexity and formation of slanted profiles of the halftone features. Currently molybdenum silicon is the preferred halftone material as it only requires processing of a single layer of material to form the absorbing areas (120) providing the required attenuating and phase shift. U.S. Pat. No. 5,869,212 discloses a method for manufacturing attenuated phase shift mask.

Due to down-scaling of technology, the features on mask will have smaller dimensions. Light propagating through the mask will become more diffracted such that less light is collected by the lens system of a lithographic tool and the obtainable resolution is reduced. In order to improve the resolution of optical lithography, lithographic systems with high numerical aperture (NA) are under development. While commercially available advanced dry lithograph systems can have a NA of about 0.9 but at the expense of an exceptionally high quality lens material, wet lithographic systems are under development offering a NA of 1 or higher. Such lithographic systems are often labelled hyper NA systems. In wet lithography, better known as immersion lithography, a liquid having a refractive index greater than 1 is present between the lens system and the substrate which is to be exposed. The presence of this immersion liquid will further improve the resolution of the system as it allows light to impinge on the exposed substrate at a larger angle.

A disadvantage of using state-of-the-art attenuated phase shift mask in hyper NA lithography is that these masks do not provide printed images with the required quality for advanced technologies. With increasing numerical aperture the image contrast image in the resist reduces, as illustrated by table 1 below for state-of-the-art attenuated halftone materials on a quartz substrate. The parameter image contrast is an image metric which is defined as the ratio of the difference between the maximum and minimum intensities to the sum of the maximum and minimum intensities in an image as obtained by projection of a mask pattern on photoresist coated substrate by a lithographic system.

TABLE 1

| Image contrast in resist | 68 nm MoSi | 24.5 nm Cr/ 99.2 nm SiON | 21 nm Ta/ 144 nm $SiO_2$ |
|---|---|---|---|
| NA 0.85 | 0.62 | 0.60 | 0.64 |
| NA 1.20 | 0.54 | 0.46 | 0.58 |

Hence there is a need to have useful att. PSM, e.g. in view of the evolution towards high numerical aperture or hyper numerical aperture lithography systems and the associated shrinkage of features sizes and pitches, which puts stronger demands on the process window of associated lithographic processes.

SUMMARY OF CERTAIN INVENTIVE ASPECTS

Certain inventive aspects to provide good attenuated phase shift masks, e.g. improved attenuated phase shift masks, methods of manufacturing such attenuated phase shift masks and methods for using such attenuated phase shift masks. It is an advantage of embodiments of the present invention to provide phase shift masks offering an increased process window for lithographic processing of a device on hyper NA lithographic systems. It is a further advantage of embodiments of the present invention to provide phase shift masks offering reduced mask error enhancement factor (MEEF) in hyper NA lithographic processing.

One inventive aspect relates to a method for designing an embedded attenuated phase shift mask or mask blank for use in a lithographic process, the mask or mask blank comprising a halftone stack, the mask or mask blank being suitable for off-axis illumination and/or use with a hyper numerical aperture (NA) system, the method comprising selecting mask setting values for the phase shift mask or mask blank, selecting process parameter values for the lithographic process, the process parameters at least comprising off-axis illumination and/or use with a hyper numerical aperture (NA) system, selecting an image performance parameter, performing an aerial image simulation using the selected mask setting values and selected process parameters values and deriving from the aerial image simulation the corresponding value for the image performance parameter, evaluating the derived image performance parameter value with respect to a predetermined image performance parameter criterion, and if the derived image performance parameter does not fulfil the image performance parameter criterion, adjusting the mask setting values based on the derived image performance parameter and repeating the performing a simulation and the evaluating. With hyper numerical aperture there is meant a numerical aperture of 1 or higher.

Image performance parameter(s) may be the image contrast in the resist, depth of focus, exposure latitude, polarization effects of the mask, Mask Error Enhancement factor (MEEF), or linewidth sensitivity to illuminator polarization.

Selecting mask setting values for the phase shift mask or mask blank may comprise selecting the number of layers in the halftone stack.

Selecting the mask setting values for the phase shift mask or mask blank may comprise selecting a type and number of the material(s) of the halftone stack. Selecting the type and number of material(s) of the halftone stack comprises selecting an absorber material and a phase-shift material.

The absorber material may be a metal, preferably Chromium or Tantalum, and the phase-shift material may be a dielectric, preferably silicon oxide or silicon oxynitride.

Selecting mask setting values for the phase shift mask or mask blank further may comprise selecting the thickness of the absorber material and/or of the phase-shift material for providing a maximum exposure latitude of at least about 12%.

Adjusting the mask setting values may comprise adjusting the selected thickness of the absorber material and/or of the phase-shift material.

Another inventive aspect relates to a method for designing an embedded attenuated phase shift mask or mask blank for use in a lithographic process, the mask or mask blank comprising a halftone stack, the method comprising selecting mask setting values for the phase shift mask or mask blank, the mask setting values at least comprising a number of layers of absorber material and phase-shift material in the halftone stack, the total number of layers being equal to or larger than 3, selecting process parameter values for the lithographic process, selecting the degree of polarization as image performance parameter, performing an aerial image simulation using the selected mask setting values and selected process parameters values and deriving from the aerial image simulation the corresponding value for the image performance parameter, evaluating the derived image performance parameter value with respect to a predetermined image performance parameter criterion, and if the derived image performance parameter does not fulfil the image performance parameter criterion, adjusting the mask setting values based on the derived image performance parameter and repeating the performing a simulation and the evaluating.

Another inventive aspect also relates to an automated method for designing an embedded attenuated phase shift mask or mask blank for use in a lithographic process, the mask or mask blank comprising a halftone stack, the mask or mask blank being suitable for off-axis illumination and/or for use in a hyper numerical aperture (NA) system, the method comprising receiving selected mask setting values for the phase shift mask or mask blank, receiving selected process parameter values for the lithographic process, the process parameters at least comprising off-axis illumination and/or use with a hyper numerical aperture (NA) system, receiving a selected image performance parameter, performing an aerial image simulation using the selected mask setting values and selected process parameters values and deriving from the aerial image simulation the corresponding value for the image performance parameter, automated evaluating of the derived image performance parameter value with respect to a predetermined image performance parameter criterion, and if the derived image performance parameter does not fulfil the image performance parameter criterion, automated adjusting the mask setting values based on the derived image performance parameter and repeating the performing a simulation and the automated evaluating.

Another inventive aspect also relates to an embedded attenuated phase-shift mask comprising a transparent substrate, and a halftone stack, the halftone stack comprising or consisting of an absorber material and a phase-shift material, wherein the thickness of the absorber material and the thickness of the phase-shift material are determined taking into account off-axis illumination.

The thickness of the absorber material and the thickness of the phase-shift material may be determined taking further into account a numerical aperture equal to or larger than 1.

The halftone stack may be configured as a bilayer stack consisting of a layer of absorber material and a layer of phase-shift material.

The halftone stack also may be configured as a multilayered stack of an alternating sequence of absorber material and phase-shift material.

The absorber material may be a metal, preferably Chromium or Tantalum, and

The phase-shift material is a dielectric, preferably silicon oxide or silicon oxynitride.

The absorber material may be Tantalum having a thickness in the approximate range 25 nm to 45 nm, preferably in the approximate range 25 nm to 35 nm, more preferably about 30 nm, and the phase-shift material may be silicon oxide having a thickness in the approximate range 135 nm to 140 nm, preferably about 140 nm.

The absorber material may be Chromium having a thickness in the approximate range 45 nm to 70 nm, preferably in the approximate range 45 nm to 60 nm, more preferably about 50 nm, and the phase-shift material may be silicon oxynitride having a thickness in the approximate range 90 nm to 110 nm, preferably about 100 nm.

Another inventive aspect also relates to a mask blank for manufacturing of an embedded attenuated phase shift mask as described above. The embedded attenuated phase shift mask comprises a transparent substrate, and a halftone stack, the halftone stack comprising or consisting of an absorber material and a phase-shift material, wherein the thickness of the absorber material and the thickness of the phase-shift material are determined taking into account off-axis illumination.

Another inventive aspect relates to a method for lithographic processing of a device, wherein the method comprises using off-axis illumination and an embedded attenuated phase shift mask as described above. The lithographic processing may comprise processing with a numeral aperture equal to or larger than 1.

Another inventive aspect also relates to a processing system, the system comprising an input means for receiving selected mask setting values for the phase shift mask or mask blank, for receiving selected process parameter values for the lithographic process, the process parameter values at least comprising off-axis illumination, and for receiving selected image performance parameter(s), a processing means for performing an aerial image simulation using the inputted selected mask setting values and selected process parameter values and for deriving from the aerial image simulation the corresponding value for the selected image performance parameter and an evaluation means for evaluating the derived image performance parameter according to a predetermined image performance parameter criterion, and an adjusting means for adjusting the mask setting values based on the derived image performance parameter if the derived image performance parameter does not fulfill the image performance parameter criterion.

The input means for receiving selected process parameter values may be adapted for receiving selected process parameters comprising at least a numerical aperture equal to or larger than 1 and the processing means for performing an aerial image simulation may be adapted for performing the aerial image simulation using selected process parameter values comprising at least a numerical aperture equal to or larger than 1.

Another inventive aspect relates to a computer program product for executing a method for designing an embedded attenuated phase shift mask and/or mask blank according to any of the above described designing methods. It also relates to a machine readable data storage device storing such a computer program product or to the transmission of such a computer program product over a local or wide area telecommunications network.

The above and other characteristics, features and advantages of certain inventive aspects will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DETAILED DESCRIPTION OF CERTAIN ILLUSTRATIVE EMBODIMENTS

Figure 1:
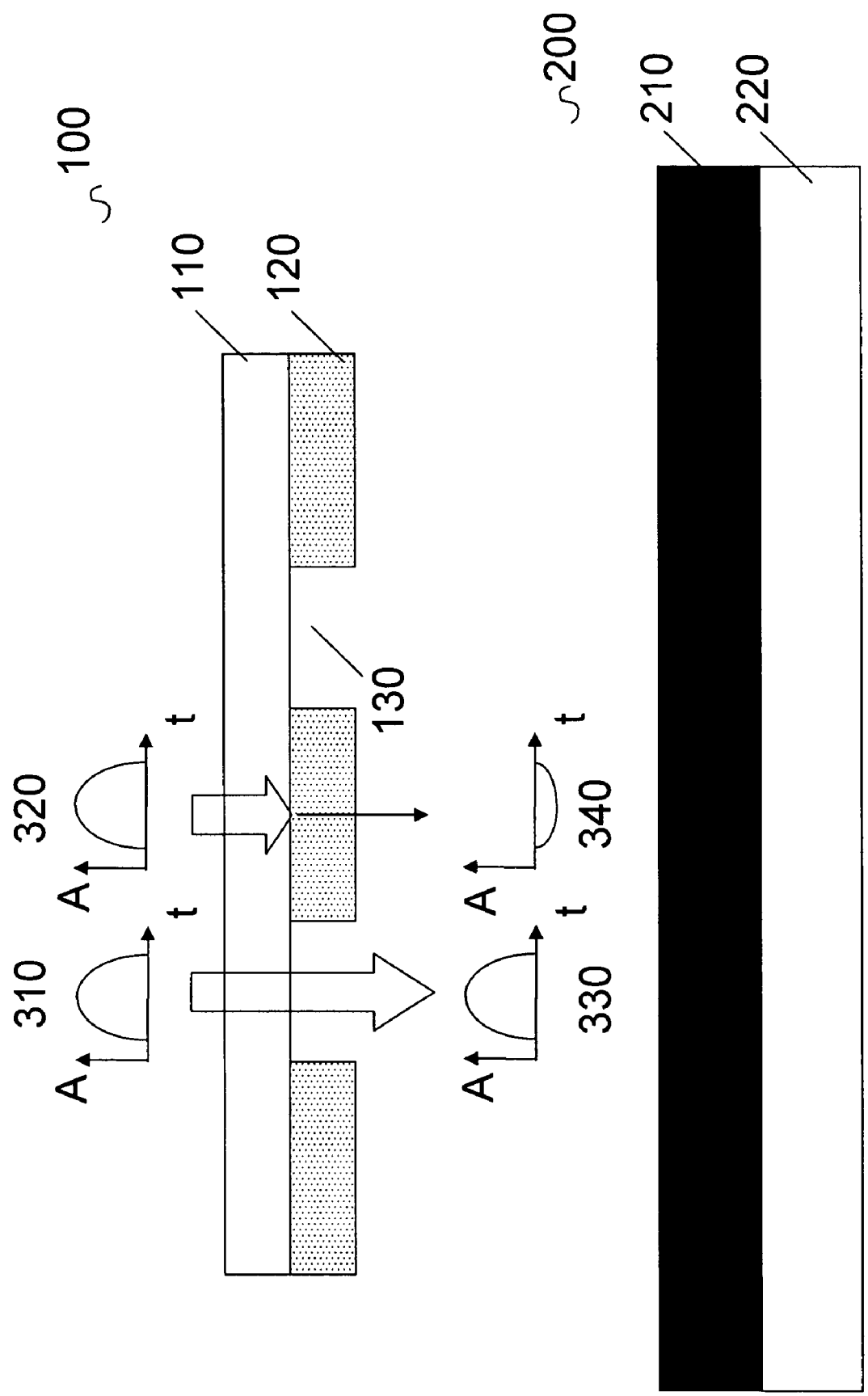
FIG. 1—prior art is a schematic representation illustrating orthogonal exposure of a substrate through an attenuated phase shift mask

Certain inventive aspects will be described with respect to particular embodiments and with reference to certain drawings but not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present description, the only relevant components of the device are A and B.

Certain inventive aspects will now be described by a detailed description of several embodiments. It is clear that other embodiments of the invention can be configured according to the knowledge of persons skilled in the art without departing from the true spirit or technical teaching of the description, which is limited only by the terms of the appended claims.

The data used in this description to illustrate embodiments of the invention were obtained using Prolith version 9.0.1 aerial image simulating tool of KLA-Tencor. It is to be noticed that other simulation software may be used without leaving the scope of the present invention. Table 2 list the lithographic process parameters used. The resist thickness was reduced with shrinking device dimensions to maintain substantially the same aspect ratio of about 2.2. Table 3 lists the values of the real (index of refraction n) and imaginary part (coefficient of extinction k) of the refractive index of the halftone materials used. As off-axis illumination source azimuthally-polarized c-quadrupole (center c=0.89, radius r=0.08 μm) illumination was used. A quartz substrate was used.

TABLE 2

| NA | Line/spacing (nm) | Resist thickness (nm) | k1 |
|---|---|---|---|
| 0.85 | 65 | 140 | 0.29 |
| 0.93 | 60 | 130 | 0.29 |
| 1.05 | 53 | 115 | 0.29 |
| 1.20 | 45 | 100 | 0.28 |
| 1.30 | 42 | 90 | 0.28 |

TABLE 3

|   | MoSi | Cr/SiON | Ta/SiO$_2$ |
|---|---|---|---|
| n | 2.343 | 0.86166/2.0507 | 1.63/1.63 |
| k | 0.586 | 1.7146/0.10796 | 2.58/0.006 |

In the prior art the thickness of the halftone materials is determined using orthogonal incident light and assuming a 6% overall transmission coefficient to obtain the desired phase difference of 180° between the transmissive areas and the halftone or partially absorbing areas. When using this prior art approach for manufacturing attenuated phase shift masks for use in hyper NA lithographic processing using off-axis illumination techniques, such as azimuthally-polarized quadruple illumination, the process windows (exposure latitude: EL, dept of focus: DOF) as given in table 4 are obtained. From this data is it clear that the process window is seriously reduced when using prior art att. PSM's. Hence the prior art approach doesn't allow determining the thickness of halftone materials to manufacture attenuated phase shift masks suitable for use in hyper NA lithographic systems.

TABLE 4

| | 68 nm MoSi | | 24.5 nm Cr/ 99.2 nm SiON | | 21 nm Ta /144 nm SiO2 | |
|---|---|---|---|---|---|---|
| Process window | EL (%) | DOF (μm) | EL (%) | DOF (μm) | EL (%) | DOF (μm) |
| NA 0.85 | 15 | 1.8 | 15 | 1.8 | 12 | 1.8 |
| NA 1.20 | 12 | 0.68 | 10 | 0.62 | 14 | 0.7 |

In a first embodiment of the invention a method is disclosed to design an embedded attenuated phase shift mask or a mask blank for creating an embedded attenuated phase shift mask, preferably for use in hyper NA lithographic processing. A mask blank is defined as a blank mask substrate e.g. glass, quartz, synthetic quartz, coated with an absorber e.g. chrome, and sometimes with resist, and used to make a mask. A mask is defined as a transparent substrate, e.g. glass or quartz plate containing information encoded as a variation in transmittance and/or phase about the features to be printed on in a photosensitive layer on a substrate. This method allows determining the total thickness $t_m$ of the absorber (130) material, the total thickness $t_d$ of the phase-shift material (140) and the number of absorber and phase-shift layers in order to obtain improved performance of lithographic processes using such embedded attenuated phase shift mask. These lithographic processes preferably are hyper NA lithographic processes, optionally using off-axis illumination.

Figure 2:
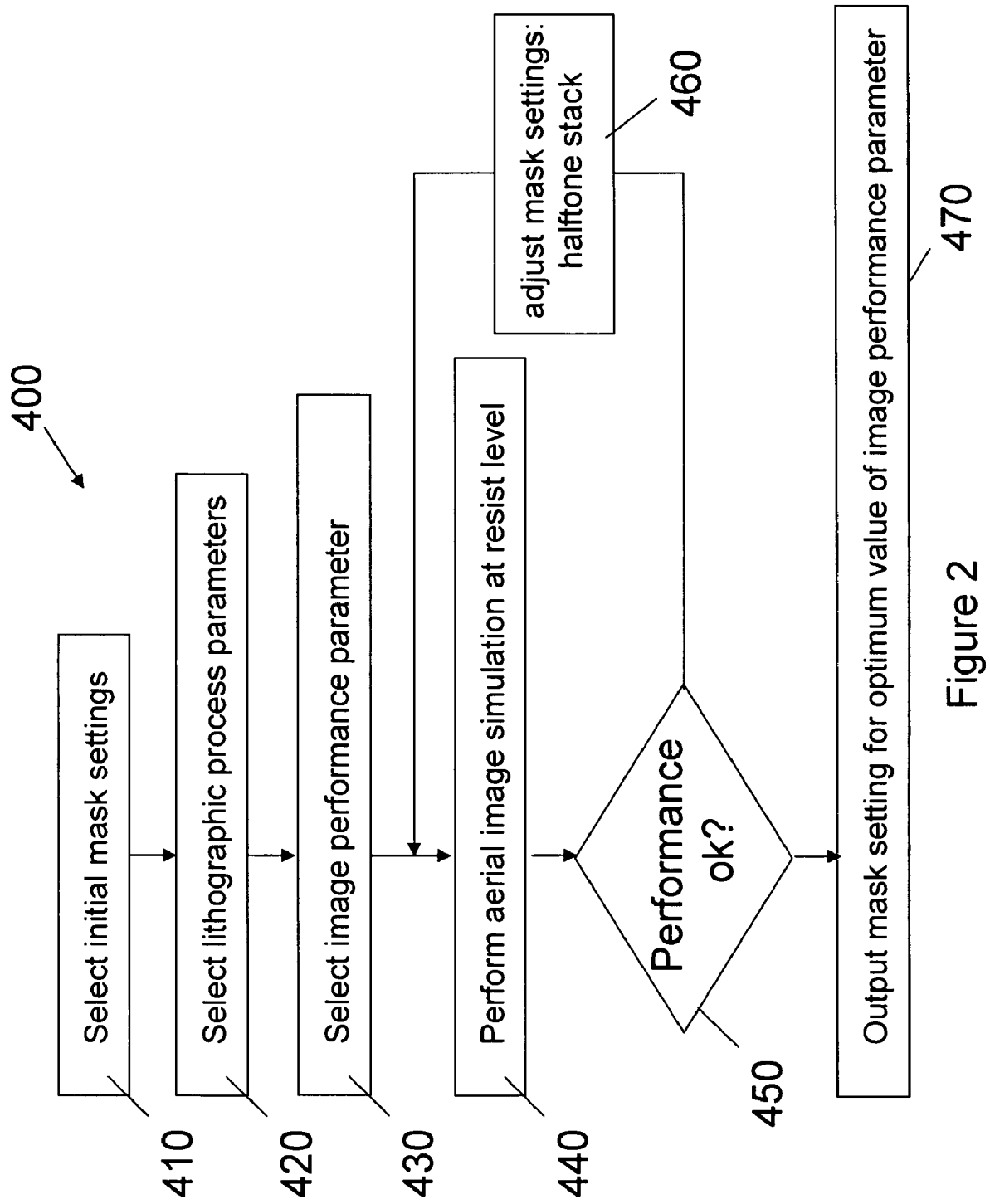
FIG. 2 shows a schematic overview of a method for designing an embedded attenuated phase shift mask according to an embodiment

An example of a method for designing (400) according to the present embodiment may comprise the following steps, illustrated by FIG. 2.

In a first step (410) the initial mask setting values of the embedded attenuated phase shift mask are provided. These initial mask setting values comprise the choice of type and number of the material(s) of the halftone stack (120), e.g. select a single material providing attenuation and phase-shift, e.g. MoSi, or select two materials respectively providing attenuation and phase-shift, such as metals as Cr, Ta on the one hand and dielectrics as SiON, SiO$_2$ on the other hand. Selecting these initial mask setting values may further comprise selecting initial values of the total thickness of these materials, the feature and the feature size, e.g. pitch, hole, line/spacing.

In a second step (420) lithographic process parameter values are selected. These lithographic process parameter values comprise selecting hyper NA value, off-axis illumination source (dipole, quadrupole, annular, . . . ). Optionally the type of photosensitive material (210) to which the mask pattern is to be transferred can be selected.

In a third step (430) the metric, i.e. the image performance parameter(s) for which the mask is to be optimized, is selected. This image performance parameter(s) can be the image contrast in the resist, depth of focus, exposure latitude, polarization effects of the mask, Mask Error Enhancement factor (MEEF), or linewidth sensitivity to illuminator polarization.

The order in which the first to the third step are performed is not limiting the embodiment.

In a fourth step (440) an aerial image simulation, e.g. at the level of the photosensitive layer (210), is performed. From this simulation the envisaged metric can be obtained. Such aerial image simulation can be done using e.g. Prolith version 9.0.1 aerial image simulating tool of KLA-Tencor.

In a fifth step (450), the performance is evaluated based on the obtained aerial image for the image performance parameter(s). Such evaluation may comprise determining whether an obtained image performance reaches a predetermined image performance level. The latter may e.g. be determining whether the process window is significantly large or whether the contrast in the resist, the depth of focus, the exposure latitude, the polarization effects of the mask, the Mask Error Enhancement factor (MEEF), or the linewidth sensitivity to illuminator polarization are below or above a predetermined value. Based on this criterion, it is decided whether the image performance is allowable or not. This evaluation step may be performed in an automated way and may be based on e.g. an algorithm, a neural network, etc. may be used. If the performance fulfils the criterion, the mask setting values providing the appropriate metric, preferably an optimum metric, can be outputted, as indicated in the outputting step (470). If the performance does not fulfil the criterion, the mask setting values determining the halftone stack may be adjusted, as indicated by step (460), and the simulation and evaluation step may be repeated for these adjusted values. Alternatively, the simulation step may be repeated for different values of the mask settings, in particular of the halftone stack, such that corresponding metrics are obtained. These metrics can then be outputted as function of the mask setting values allowing determining the mask setting values which provide an optimal metric with respect to the metrics studied. A mask blank for the corresponding embedded attenuated phase shift mask and/or the mask itself can be manufactured according to these outputted mask setting values. In an example of an automated method for designing an embedded attenuated phase shift mask, instead of the selecting step for selecting the initial mask setting values or for providing the initial mask setting values, a receiving step for receiving selected initial mask setting values is performed. Instead of selecting lithographic process parameter values, a receiving step for receiving selected lithographic process parameter values is performed and instead of selecting an image performance parameter a receiving step for receiving an image performance parameter is performed. The parameters comprise the same features and limitations as described in the selection steps above. The aerial image simulation, the evaluation step and the adjusting step then typically are automated steps.

In case the halftone stack (120) is composed of two different materials, one can optionally decide to distribute the obtained thickness $t_m$, $t_d$ for either material over multiple layers. The latter can be performed during the initial mask setting values selection step, or it can be performed after optimisation of the thickness, based on a single metal layer and a single dielectric. Instead of a bilayer halftone stack a multi-layered halftone stack is obtained comprising an alternating sequence of metallic (130) and dielectric (140) layers the total thickness being substantially equal to the obtained thickness $t_m$, $t_d$ for either material in a bilayer stack. If it is decided to distributing the material over multiple layers after optimisation of the total thickness to be obtained, steps (440, 450) thus can be repeated for different values of the mask settings for further optimization. The above decision steps may be performed in automated way, e.g. according to predetermined algorithms.

It is an advantage that the hyper NA and the off-axis illumination properties of advanced lithographic process can be taken into account when determining the composition and thickness of halftone stack of an embedded attenuated phase shift in view of the desired lithographic performance. The method of the first embodiment for determining the composition of the halftone stack of att. PSM's is applicable for lithographic process using an NA equal to or larger than about 0.85. Preferably the method is used for design of att. PSM's for in lithographic process using a NA equal to or larger than about 1.

Figure 3C:
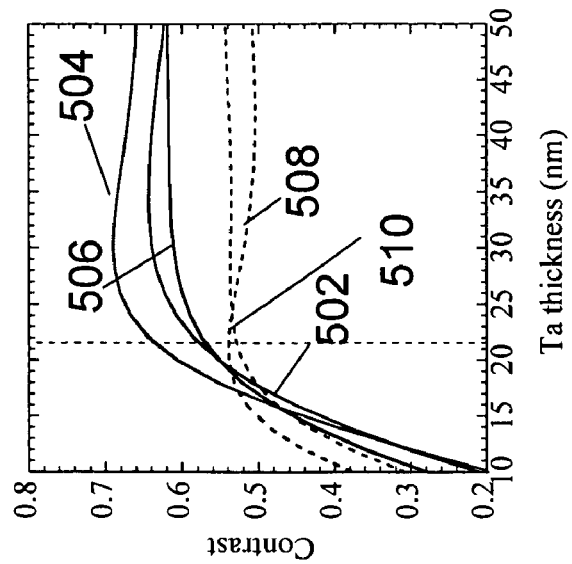
FIG. 3a-c depicts response curves showing image contrast versus thickness of the absorber layer for different halftone materials according to an embodiment (a) molybdenum silicon (MoSi), (b) chromium oxynitride (Cr/SiON), (c) tantalum oxide (Ta/SiO$_2$)
Figure 3B:
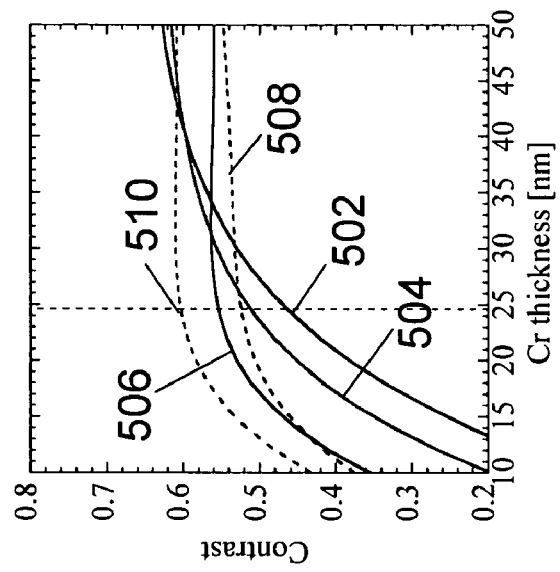
Figure 3A:
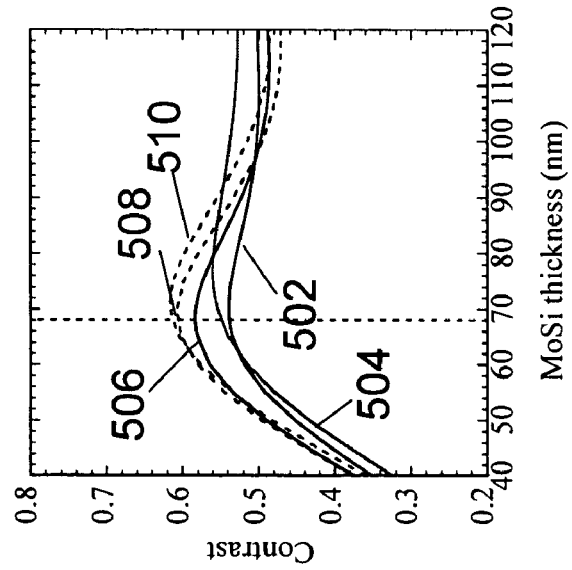

Using the above methodology response curves such as shown in FIGS. 3a-c are obtained. These figures show image contrast versus thickness of the absorber layer for the different halftone materials as available in the art (a) molybdenum silicon (MoSi), (b) chromium oxynitride (Cr/SiON), (c) tantalum oxide (Ta/SiO$_2$) for NA values ranging approximately from 0.85 to 1.3. Numerical apertures of approximately 1.3, 1.2, 1.05, 0.93 and 0.85 are indicated by curves 502, 504, 506, 508 and 510 respectively. From these figures one can conclude that for the given lithographic process parameter values and NA=1.2, the optimized thickness for the metal layer in the bilayer absorber stack is about 50 nm for Cr with about 99 nm of SiON and about 30 nm for Ta with about 139 nm SiO$_2$. For MoSi the thickness is slightly increased to about 71 nm.

Figure 4C:
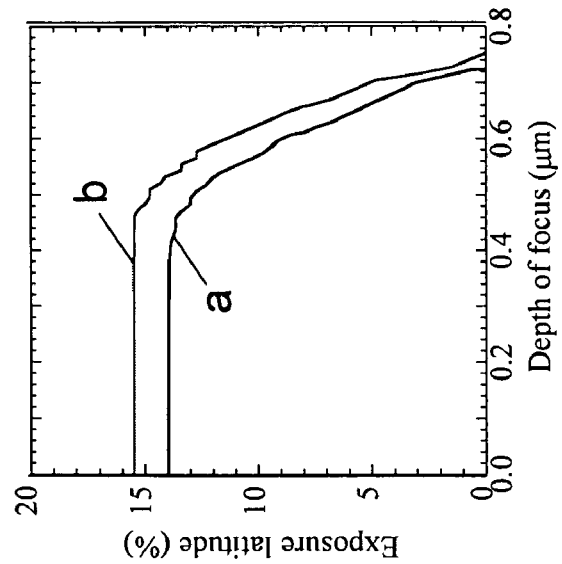
FIG. 4a-c depicts process windows, i.e. exposure latitude (EL %) versus depth of focus (DOF nm) at NA of 1.2 and line/spacing of 45 nm for different halftone materials according to an embodiment (a) molybdenum silicon (MoSi), (b) chromium oxynitride (Cr/SiON), (c) tantalum oxide (Ta/SiO$_2$)
Figure 4B:
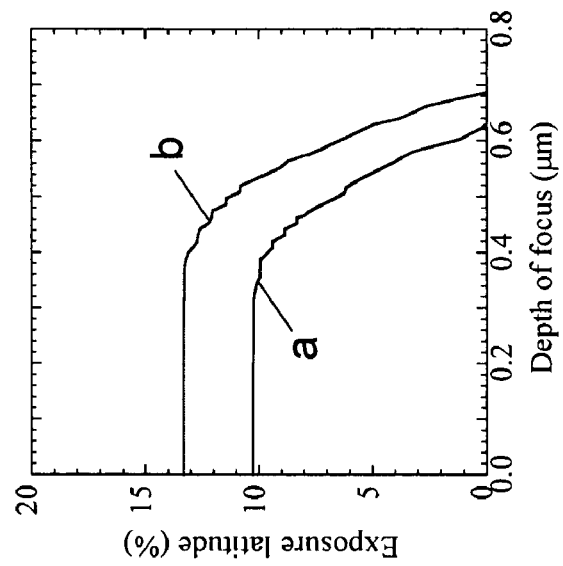
Figure 4A:
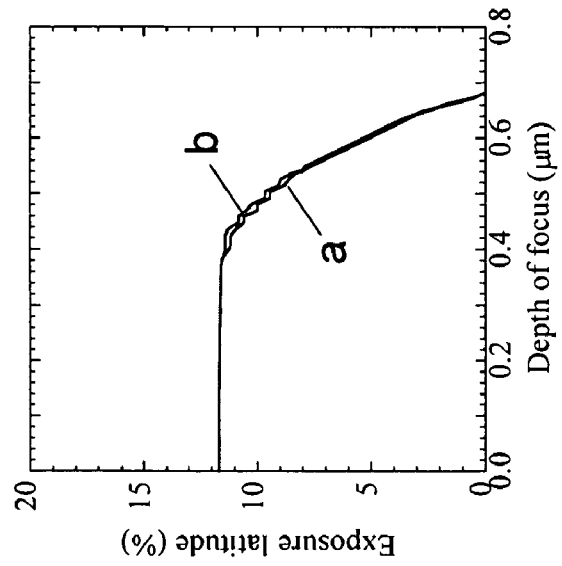

FIGS. 4a-c show a comparison between the process window obtained when using prior art attenuated phase shift masks (curve a) and when using attenuated phase shift masks according to embodiments of the invention (curve b) in hyper NA lithographic processing to form line/spacing of about 45 nm. FIG. 4a shows the process window for a prior art molybdenum siliconoxynitride layer with a thickness of 68 nm (curve a) having a process window of EL ~13% and DOF ~0.68 μm while the molybdenum siliconoxynitride layer according to an embodiment of the present invention has a thickness of 77 nm (curve b) and a process window of EL ~13% and DOF ~0.68 μm. FIG. 4b shows the process window for a prior art stack of 25 nm Cr/99.2 nm SiON (curve a) having a process window of exposure latitude (EL) ~10% and depth of focus (DOF) ~0.62 μm while the Cr/SiON stack according to an embodiment of the present invention has a thickness of 50 nm Cr/99.2 nm SiON (curve b) and a process window of EL ~13.2% and DOF ~0.68 μm. FIG. 4c shows the process window for a prior art stack of 21 nm Ta/50 nm SiO$_2$ (curve a) having a process window of EL ~14% and DOF ~0.72 um while the Ta/SiO$_2$ stack according to an embodiment of the present invention has a thickness of 30 nm Ta/50 nm SiO$_2$ SiO$_2$ (curve b) and a process window of EL ~15.2% and DOF ~0.74 μm. From these curves the advantage of an attenuated phase shift mask according to one embodiment when performing hyper NA lithographic processing can be concluded. In case the absorbing area is formed by a bilayer of halftone materials, e.g. a bilayer of chromium oxynitride or of tantalum oxide, the process window can be improved by determining the thickness of the halftone material stack according to the one embodiment. In case the absorbing area is formed by a monolayer of halftone materials, e.g. MoSi, no substantial difference in process window is obtained at hyper NA lithographic processing; however the process window for both type monolayers, i.e. prior art and optimized according to one embodiment, at hyper NA processing is less compared to the process window for lithographic processing using lower NA values, e.g. NA less than about 1.

Figure 5:
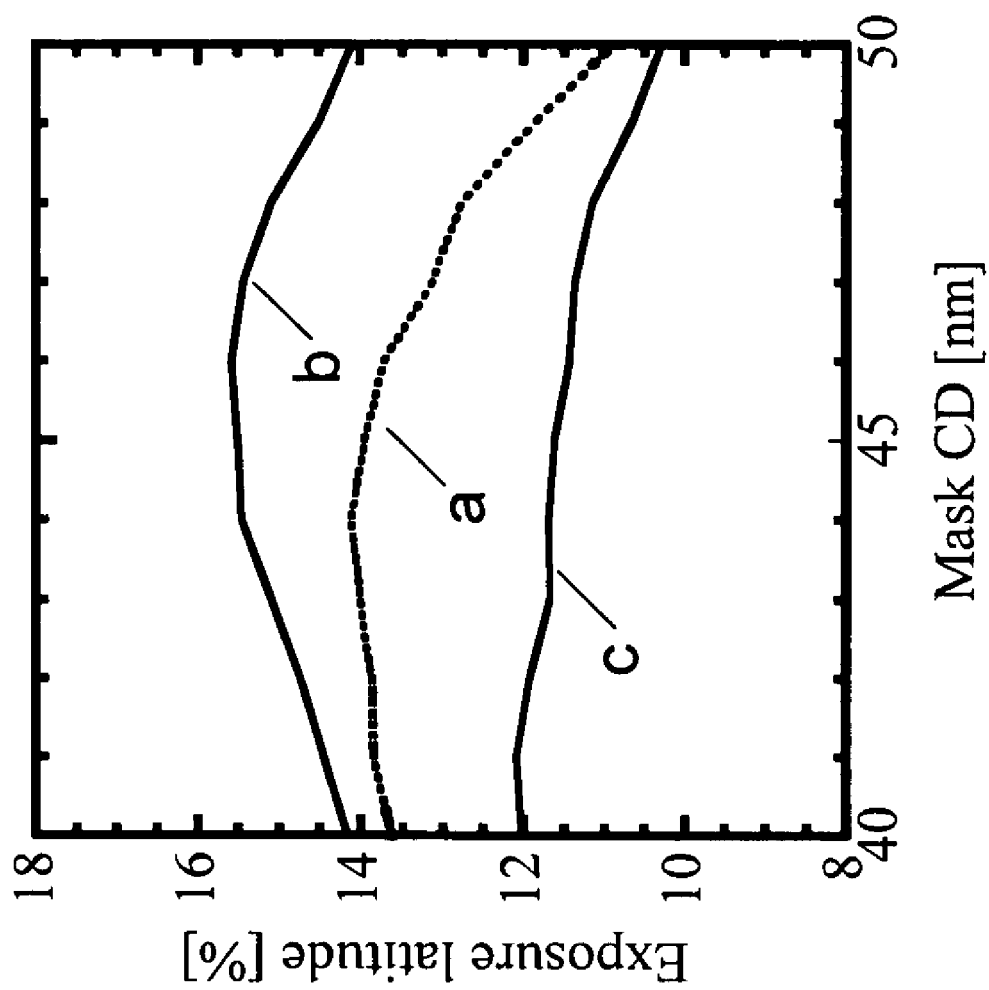
FIG. 5 depicts the process window as function of the dimension on mask (Mask CD, nm) at NA of 1.2 and targeted line/spacing of 45 nm for different halftone materials according to an embodiment (a) 21 nm tantalum oxide (Ta/SiO$_2$), (b) 30 nm tantalum oxide (Ta/SiO$_2$), (c) 68 nm molybdenum silicon (MoSi)

FIG. 5 shows the relationship between the dimension of a feature on mask (mask CD nm) and the exposure latitude (EL %), using prior art attenuated phase shift masks (curve c: 68 nm MoSi, curve a: 21 nm Ta/144 nm SiO$_2$) and using attenuated phase shift mask according to embodiments of the invention (curve b: 30 nm Ta/144 nm SiO$_2$) in hyper NA lithographic processing to form line/spacing of 45 nm.

An attenuated phase shift mask according to one embodiment offers a reduced sensitivity of the hyper NA lithographic processing to variations in the dimensions. Not only is the process window as expressed by the exposure latitude the largest for the improved mask at the targeted dimension of 45 nm, it remains the largest for dimension which deviate from and hence are larger or smaller than the targeted dimension. Table 5 below lists the Mask Error Enhancement factor (MEEF) for the three masks represented in FIG. 5. With MEEF is meant the incremental change in the final resist feature size per unit change in the corresponding mask feature size, where the mask dimension is scaled to wafer size by the reduction ratio of the imaging tool. It is abbreviated MEEF or MEF. A MEEF value of 1 implies a linear imaging of mask features to the wafer. The optimized absorber layer stack (curve b) has the smallest MEEF. The smaller MEEF of the optimized Ta/SiO$_2$ contributes to the larger process window for dimensions deviating from the target dimension. Whereas for the prior art single layer MoSi attenuated phase masks the dimensions on mask were biased to correct for dimensional variation, one embodiment alleviates the need for such biasing due to the smaller MEEF of the improved attenuated phase shift masks.

TABLE 5

| Type mask | MEEF |
| --- | --- |
| a. 21 nm Ta/144 nm SiO$_2$ | 3.77 |
| b. 30 nm Ta/144 nm SiO$_2$ | 3.19 |
| c. 68 nm MoSi | 4.38 |

Figure 6B:
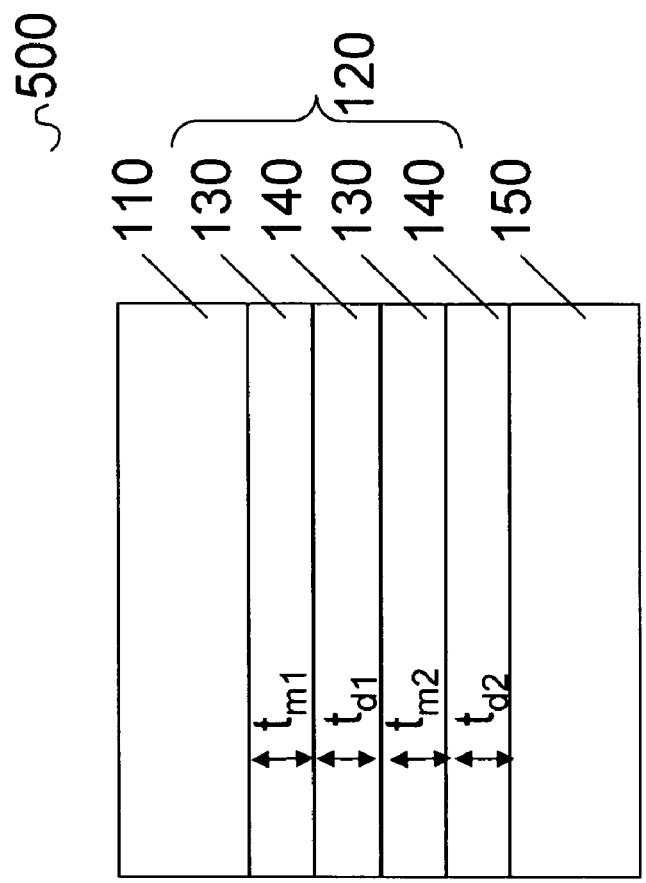
FIG. 6a-b shows embedded attenuated phase shift mask blanks comprising a bilayer halftone stack (a) or a multilayer halftone stack (b) according to an embodiment
Figure 6A:
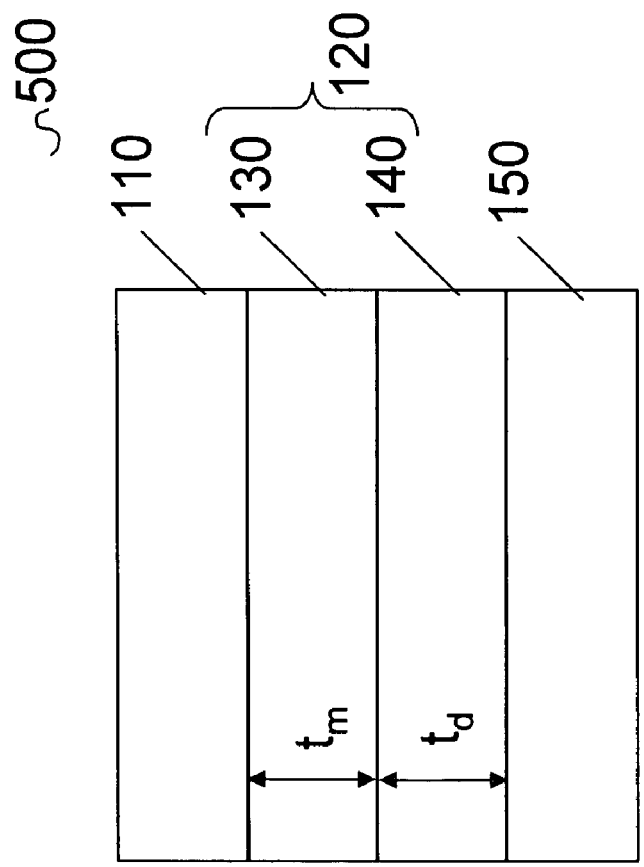

In a second embodiment a halftone stack is disclosed comprising a sequence of absorbing and phase-shift materials. In the first embodiments a. halftone stack was disclosed, as illustrated by FIG. 6a, consisting of a metallic layer, accounting for a substantial part of the attenuation of the light propagating through the halftone stack, and a dielectric layer, accounting for a substantial part of the phase shift of the light propagating through the halftone stack. The thickness of the dielectric $t_d$ and the metallic material $t_m$ were optimized according to a method disclosed in these previous embodiments. Instead of providing the absorber material and the phase-shift material in single layers, one can distribute the absorber material and phase-shift material over multiple layers. FIG. 6b illustrates an example of such multilayer halftone stack. The sum of the thickness of the two metallic layers (130) $t_{m1}+t_{m2}$ corresponds to the thickness $t_m$ of a single metallic layer optimized according to the first embodiment such that substantially the same attenuation of the propagating light is obtained for both halftone stacks. Likewise, the sum of the thickness of the two dielectric layers (140) $t_{d1}+t_{d2}$ corresponds to the thickness $t_d$ of a single dielectric layer optimized according to previous embodiments such that substantially the same phase shift of the propagating light is obtained for both halftone stacks. Once the optimum thickness $t_d$ of the metallic material (130) and the optimum thickness $t_m$ of the dielectric material (140) is determined, one can select the number of layers to be formed for each material.

A halftone stack according to the second embodiment of the invention thus comprises at least one layer of an absorber material, e.g. a metallic layer such as Chromium, Tantalum, and at least one layer of a dielectric material, e.g. oxide or oxynitride. A halftone stack according to the second embodiment of the invention can also comprise at least two layers of an absorber material (130), e.g. a metallic layer such as Chromium, Tantalum, and at least one layer of a dielectric material (140), e.g. oxide or oxynitride, the layer of dielectric material (140) being sandwiched between two layers of an absorber material (130). A halftone stack can also comprise at least one layer of an absorber material (130), e.g. a metallic layer such as Chromium, Tantalum, and at least two layers of a dielectric material (140), e.g. oxide or oxynitride, the layer of an absorber material (130) being sandwiched between two layers of a dielectric material (140). A halftone stack can also comprise multiple layers of an absorber material (130), e.g. a metallic layer such as Chromium, Tantalum, and e.g. multiple layers of a dielectric material (140), e.g. g. oxide or oxynitride, such that alternatively a layer of absorber (130) and dielectric (140) material is present. Hence layers of absorber (130) and dielectric (140) materials may be arranged in alternating sequence.

By way of illustration, based on FIGS. 3a-c for the given lithographic process parameter values and NA=1.2, the optimized thickness for the metal in the halftone stack (120) is about 50 nm for Chromium with about 99 nm of SiON and about 30 nm for Tantalum with 144 nm SiO$_2$. For MoSi the thickness is slightly increased to about 71 nm. One can construct this halftone stack (120) as a single layer of about 50 nm of Chromium and a single layer of about 99 nm of SiON, as an alternating sequence of two about 25 nm thick Chromium layers and about 49 nm thick SiON layers, i.e. about 25 nm Chromium/49 nm SiON/25 nm Chromium/49 nm SiON, or as an alternating sequence of three about 13.3 nm thick Chromium layers and about 33.3 nm thick SiON layers, i.e. about 13.3 nm Chromium/33.3 nm SiON/13.3 nm Chromium/33.3 nm SiON/13.3 nm Chromium. For the given lithographic process, in particular for the given NA of the hyper NA lithographic tool, any combination of Chromium and SiON layers is possible provided that the total thickness of Chromium and SiON material equals the optimized thickness of respectively about 50 nm and 99 nm.

In a third embodiment of the invention the improved performance regarding polarization of light propagating through an embedded attenuated phases shift mask according to embodiments of the invention is disclosed. The embodiment thus relates to a method for designing an embedded attenuated phase shift mask or for designing a mask blank for an embedded attenuated phase shift mask according to the first embodiment, or to an embedded attenuated phase shift mask according to the second embodiment, designed for improved performance regarding polarization of light propagating through the mask. The latter is obtained by selecting polarization of light, e.g. as present at the resist level, as the image performance parameter. The method for designing and the embedded attenuated phase shift mask or mask blank does not need to be especially suitable for high numerical aperture (N.A.) systems or for systems with off-axis illumination. In other words, the method is suitable for phase shift mask or mask blanks suitable on-center illumination, i.e. illumination generating perpendicular light incidence on the mask and/or suitable for systems with a numerical aperture smaller than 1, even numerical apertures smaller than 0.85.

MoSi is known to polarize incoming light (320) in a TM mode, i.e. in a direction within the plane of incidence which is a plane formed by the propagation direction of the light wave and a vector normal to the plane of the reflecting surface of the substrate (200). When this TM polarized light (340) impinges on the substrate (200), a substantial part of this incident light will be reflected at the surface of this substrate (200). Hence not all light energy available in an incoming TM electromagnetic wave will enter the photosensitive layer and only a minor part of the energy in the incoming TM wave will contribute to the photolithographic patterning process. Metallic layers, such as Cr and Ta, are know to polarize incoming light (320) in a TE mode i.e. in a direction perpendicular to the plane of incidence. When this TE polarized light (340) impinges on a substrate (200), a substantial part of this light is transmitted into the substrate and will contribute to the photolithographic process. The different reflectance behavior and hence the dependency of the lithographic process on the polarization state of the incoming light will become more pronounced when light is impinging on the substrate at an angle.

In off-axis illumination light will impinge on the substrate (200) at an angle, making the corresponding lithographic process more prone to polarization effects. The embodiment is therefore of particular use in lithographic processes employing off-axis illumination. In off-axis illumination an aperture is used to limit the light from an illumination system to only enter a lens system at an angle to the optical axis of the lens system. Off axis illumination is used with advanced exposure systems such as steppers and scanners to improve resolution at a given wavelength. Various off-axis illumination techniques exist such as dipole illumination, quadrupole illumination, annular illumination, depending on the number of light sources present, the shape thereof and their position with respect to optical axis of the lithographic system.

Figure 7B:
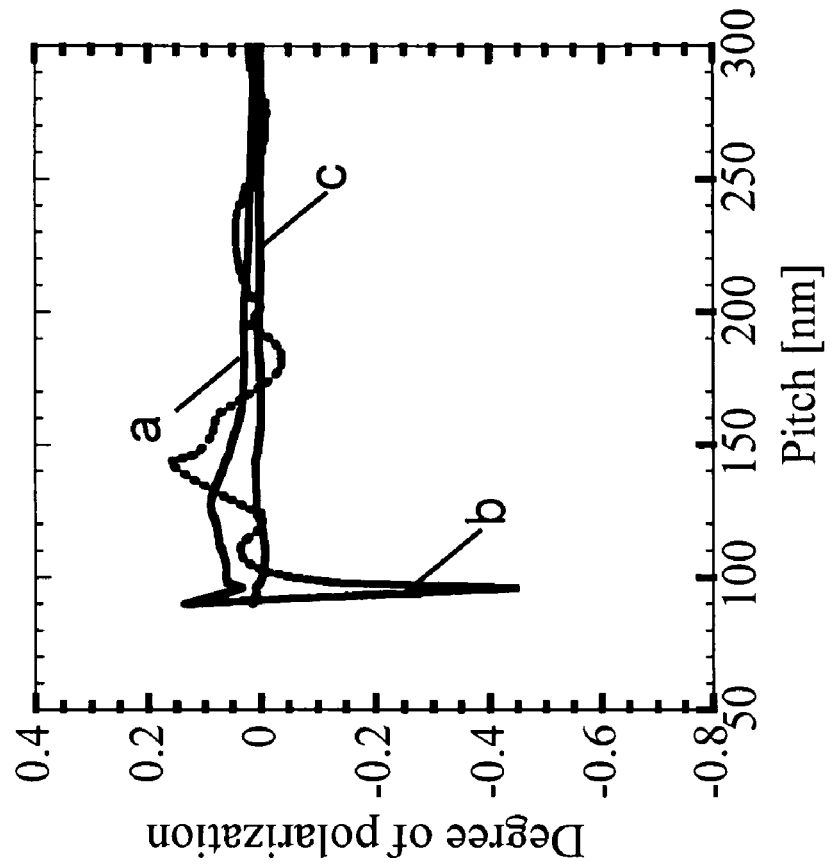
FIG. 7a-b shows degree of polarization as function of pitch (nm) for $0^{th}$ order (a) and $1^{st}$ order (b) component of the light transmitted through different halftone stacks according to an embodiment: an alternating sequence of 4 layers of 10 nm Ta and of 4 layers of 35 nm SiO$_2$ (a), a bilayer of 30 nm Ta/139 nm SiO$_2$ (b), a monolayer of 68 nm MoSi (c).
Figure 7A:
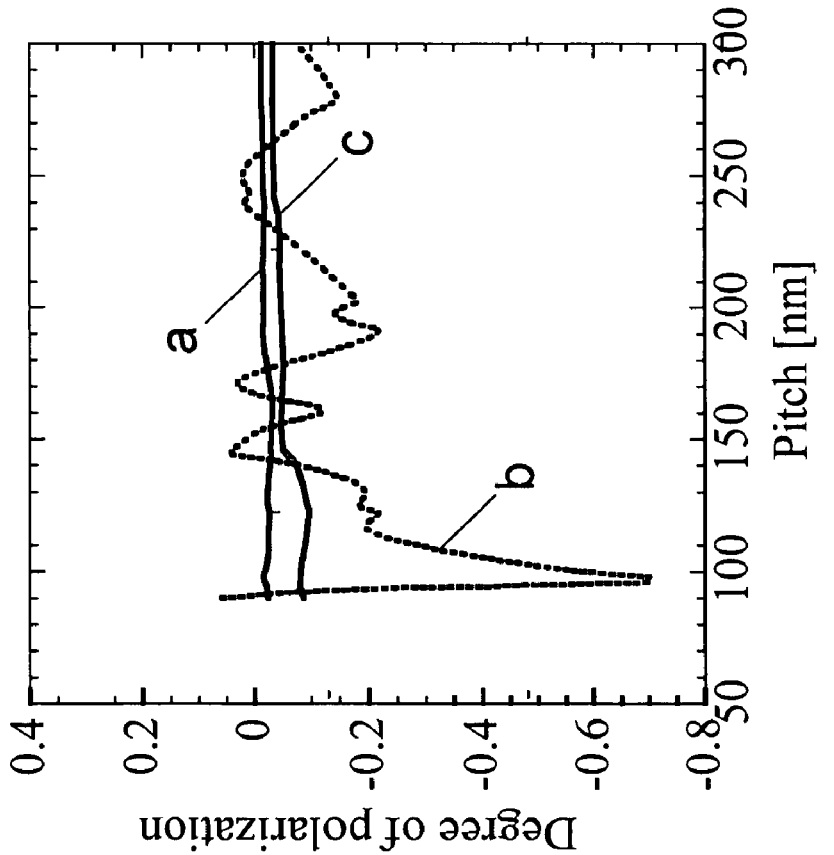

FIGS. 7a-b shows the degree of polarization (DoP) as function of the pitch (nm) for 3 halftone stacks: an alternating sequence of 4 layers of 10 nm Ta and of 4 layers of 35 nm SiO$_2$ (a), a bilayer of 30 nm Ta/139 nm SiO$_2$ (b), a monolayer of 68 nm MoSi (c). FIG. 7a shows the DoP for the $0^{th}$ order peak of the transmitted light (340) while FIG. 7B shows the DoP for the $1^{st}$ order peak of the transmitted light (340). The degree of polarization is defined as the relative ratio of the energy present in the TM component and in the TE component of the incoming wave: DoP=(TM−TE)/(TM+TE). Although an optimized halftone bilayer stack of Ta/SiO$_2$ provides an improved EL and DOF as disclosed in previous embodiments, in particular in hyper NA lithographic processing, a multilayer halftone stack of Ta/SiO$_2$ additionally provides improved degree of polarization. In case a multilayered embedded attenuated phase shift mask according to other embodiments is used the dependence of the degree of polarization on pitch can be moderated, certainly for the $0^{th}$ order. Moreover the degree of polarization for the $1^{st}$ order component can be kept slightly positive. The number of metal (130) layers and the number of dielectric layers (140), for a given total metal thickness $t_m$ and dielectric thickness $t_d$, is selected to obtain an optimum DoP for a given pitch range. With optimum DoP is meant a DoP which is in the range of approximately −0.2 to 0.2, preferably in the range of approximately −0.1 to 0.1. With given pitch range is meant a pitch approximately ranging from above 300 nm to 50 nm, preferably a pitch in the range 300 nm to 50 nm.

Table 6 below lists the lithographic performance of the bilayer and a multilayer halftone stack optimized for NA=1.2 and for line-spacing of 45 nm process of table 2.

TABLE 6

| Process window | 30 nm Ta/139 nm SiO$_2$ | | 4x (10 nm Ta/35 nm SiO$_2$) | |
|---|---|---|---|---|
| | Dose to size (mJ/cm$^2$) | DOF at 8% EL (μm) | Dose to size (mJ/cm$^2$) | DOF at 8% EL (μm) |
| NA 1.20 | 75 | 0.62 | 55 | 0.60 |

In a fourth embodiment of the invention mask blanks are disclosed. A mask blank is defined as a blank mask substrate e.g. glass, quartz, synthetic quartz, coated with an absorber e.g. chrome, and sometimes with resist, and used to make a mask. A mask is defined as a transparent substrate, e.g. glass or quartz plate containing information encoded as a variation in transmittance and/or phase about the features to be printed on in a photosensitive layer on a substrate. The composition and thickness of these mask blanks are determined using the method of other embodiments of this description. As shown in FIGS. 6a and 6b mask blanks (500) for manufacturing of an attenuated phase shift mask according to embodiments of the invention comprises a transparent substrate (110) which is coated with one or more layers. A mask blank (500) according to one embodiment is shown in FIG. 6a. It further comprises a bilayer absorber stack (120) consisting of a metallic layer (130) in contact with the transparent substrate (110) and a dielectric layer (140) in contact with the metallic layer (130). A mask blank (500) according to another embodiment is shown in FIG. 6b. It further comprises a multilayer absorber stack (120). In the mask blank illustrated in FIG. 6b a stack of metallic layer (130)/dielectric layer (140)/metallic layer (130)/dielectric layer (140) is formed on the substrate (110. More generally, a multilayer absorber stack (120) according to an embodiment of the invention comprises at least three layers in which in turn metallic (130) or dielectric (140) material is used. This alternating stack of metallic (130) and dielectric layers (140) provides the attenuation and phase shift required for embedded attenuating phase shift mask which provides sufficient process window when used in hyper NA lithographic processing. The mask blanks can then be used to manufacture embedded attenuated phase-shift masks providing improved process window and performance in particular in hyper NA lithographic processing.

Optionally an additional absorber layer (150), e.g. a metallic layer such as chromium, and/or a resist layer (now shown) can be present in contact with the dielectric layer (140). Optionally identical trenches are etched in the transparent substrates on either side of the halftone features. International application WO 2005/090931 shows an Att. PSM where a chromium layer (114) is present on top of the halftone features (112). This chromium layer is patterned such that selected halftone features are partially covered with this chromium resulting in a further overall attenuation of the light propagating through these halftone features. Trenches (118) with substantially the same depth are etched in the substrate (110) such that between these trenches (118) substantial no phase difference occurs.

In a fifth embodiment an embedded attenuated phase shift mask according to one or more of the previous embodiments is used in lithographic processing of a device. This embodiment relates to a method of lithographic processing of a device using an embedded attenuated phase shift mask (100) according to embodiments of the present invention, whereby the total thickness $t_m$ of the absorber (130) material, the total thickness $t_d$ of the phase-shift material (140) and the number of absorber and phase-shift layers is determined according to embodiments of the invention. Such lithographic processing preferably comprises providing a substrate (220), forming a photosensitive layer (210) over the substrate (220), illuminating the photosensitive layer (210) through an embedded attenuated phases shift mask (100) according to an embodiment, forming an illumination pattern in the photosensitive layer (210) and developing the illuminated photosensitive layer (210) to form a pattern therein. Positive and negative photosensitive layers may be used in combination with a corresponding mask pattern. Preferably the lithographic processing used is a hyper NA lithographic process, such as immersion lithographic. Preferably the lithographic processing employs off-axis illumination such as dipole illumination, quadrupole illumination, annular illumination.

Figure 8:
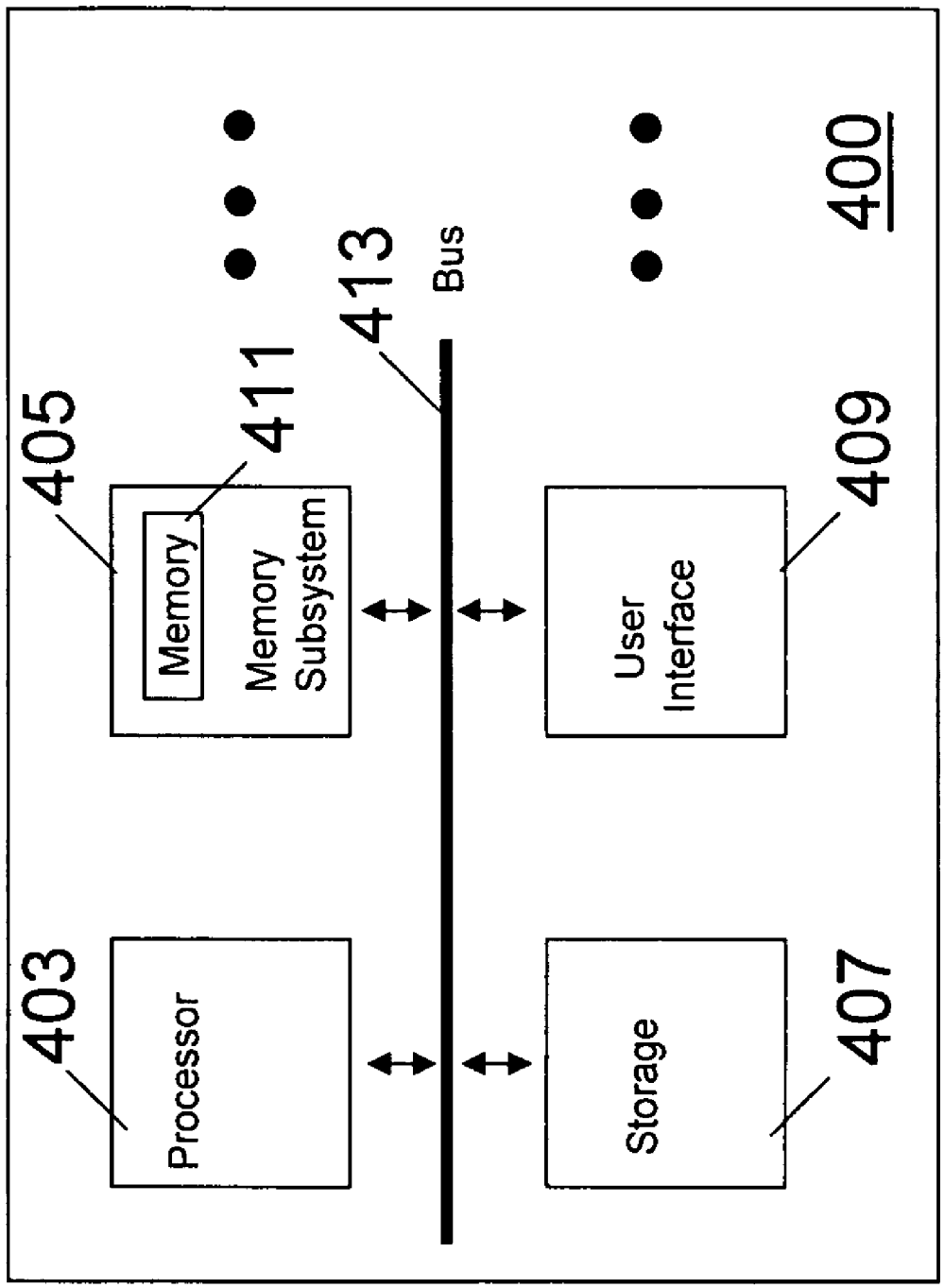
FIG. 8 shows a processing system adapted for performing at least part of any of the method embodiments.

A sixth embodiment is a processing system wherein the designing or creating method embodiments according to the present invention are at least partly implemented, or in other words, to a processing system adapted for performing a method for designing or creating an attenuated phase shift mask according to any of the previous embodiments. An exemplary processing system 400 is shown in FIG. 8. FIG. 8 shows one configuration of processing system 400 that includes at least one programmable processor 403 coupled to a memory subsystem 405 that includes at least one form of memory, e.g., RAM, ROM, and so forth. A storage subsystem 407 may be included that has at least one disk drive and/or CD-ROM drive and/or DVD drive. In some implementations, a display system, a keyboard, and a pointing device may be included as part of a user interface subsystem 409 to provide for a user to manually input information. Ports for inputting and outputting data also may be included. More elements such as network connections, interfaces to various devices, and so forth, may be included, but are not illustrated in FIG. 8. The various elements of the processing system 400 may be coupled in various ways, including via a bus subsystem 413 shown in FIG. 8 for simplicity as a single bus, but will be understood to those in the art to include a system of at least one bus. The memory of the memory subsystem 405 may at some time hold part or all (in either case shown as 411) of a set of instructions that when executed on the processing system 400 implement the step(s) of the method embodiments described herein. It is to be noted that the processor 403 or processors may be a general purpose, or a special purpose processor, and may be for inclusion in a device, e.g., a chip that has other components that perform other functions. Thus, one or more aspects of the present invention can be implemented in digital electronic circuitry, or in computer hardware, firmware, software, or in combinations of them. Furthermore, aspects of the invention can be implemented in a computer program product tangibly embodied in a carrier medium carrying machine-readable code for execution by a programmable processor. Method steps of aspects of the invention may be performed by a programmable processor executing instructions to perform functions of those aspects of the invention, e.g., by operating on input data and generating output data. Accordingly, the embodiment includes a computer program product which provides the functionality of any of the methods described above when executed on a computing device. Further, the embodiment includes a data carrier such as for example a CD-ROM or a diskette which stores the computer product in a machine-readable form and which executes at least one of the methods described above when executed on a computing device. Nowadays, such software is often offered on the Internet or a company Intranet for download, hence the embodiment includes transmitting the computer product over a local or wide area network.

In some embodiments, the processing system comprises a processor 403 and a program executed by the processor. The program may comprise a an input module configured to receive selected mask setting values for the phase shift mask or mask blank, selected process parameter values for the lithographic process, the process parameter values at least comprising off-axis illumination, and selected image performance parameter(s). In one embodiment, the input module may be adapted for receiving selected process parameters comprising at least a numerical aperture equal to or larger than 1.

The program may further comprise a processing module configured to perform an aerial image simulation using the inputted selected mask setting values and selected process parameter values and to derive from the aerial image simulation the corresponding value for the selected image performance parameter. In one embodiment, the processing module may be adapted for performing the aerial image simulation using selected process parameter values comprising at least a numerical aperture equal to or larger than 1.

The program may further comprise an evaluating module configured to evaluate the derived image performance parameter with respect to a predetermined image performance parameter criterion. The program may further comprise an adjusting module configured to adjust the mask setting values based on the derived image performance parameter, if the derived image performance parameter does not fulfill the image performance parameter criterion.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of designing an embedded attenuated phase shift mask or mask blank for use in a lithographic process, the mask or mask blank comprising a halftone stack, the mask or mask blank being suitable for off-axis illumination and/or hyper numerical aperture (NA), the method comprising:

selecting mask setting values for the phase shift mask or mask blank and process parameter values for the lithographic process, the process parameter values comprising at least a numerical aperture equal to or larger than about 1, selecting an image performance parameter, performing an aerial image simulation using the selected mask setting values and deriving from the aerial image simulation the corresponding value for the image performance parameter, evaluating the derived image performance parameter value with respect to a predetermined image performance parameter criterion, and if the derived image performance parameter does not fulfill the image performance parameter criterion, adjusting the mask setting values based on the derived image performance parameter and repeating the performing a simulation and the evaluating, wherein adjusting the mask setting values based on the derived image performance parameter comprises adjusting a selected thickness of an absorber and/or phase shift material taking into account said derived performance parameter.

2. The method of claim 1, wherein the image performance parameter is one of the following: the image contrast in the resist, a depth of focus, an exposure latitude, a polarization effects of the mask, a mask error enhancement factor, and a linewidth sensitivity to illuminator polarization.

3. The method of claim 1, wherein selecting mask setting values for the phase shift mask or mask blank comprises selecting a type and number of the material(s) of the halftone stack.

4. The method of claim 3, wherein selecting the type and number of material(s) of the halftone stack comprises selecting an absorber material and a phase-shift material.

5. The method of claim 4, wherein the absorber material is a metal and the phase-shift material is a dielectric.

6. The method of claim 5, wherein the absorber material is chromium or tantalum, and the phase-shift material is silicon oxide or silicon oxynitride.

7. The method of claim 4 wherein selecting mask setting values for the phase shift mask or mask blank further comprises selecting the thickness of the absorber material and/or of the phase-shift material for providing a maximum exposure latitude of at least about 12%.

8. An embedded attenuated phase-shift mask comprising a transparent substrate, and a halftone stack, the halftone stack comprising an absorber material and a phase-shift material, the thickness of the absorber material and the thickness of the phase-shift material being determined taking into account off-axis illumination and taking further into account a numerical aperture equal to or larger than about 1.

9. The phase-shift mask of claim 8, wherein the halftone stack is configured as a bilayer stack comprising a layer of absorber material and a layer of phase-shift material.

10. The phase-shift mask of claim 8, wherein the halftone stack is configured as a multilayered stack of an alternating sequence of absorber material and phase-shift material.

11. The phase-shift mask of claim 8, wherein the absorber material is a metal, and the phase-shift material is a dielectric.

12. The phase-shift mask of claim 11, wherein the absorber material is Tantalum having a thickness in the range of approximately 25 nm to 45 nm, preferably in the range 25 nm to 35 nm, more preferably about 30 nm, and the phase-shift material is silicon oxide having a thickness in the range of approximately 135 nm to 140 nm, preferably about 140 nm.

13. The phase-shift mask of claim 11, wherein the absorber material is Chromium having a thickness in the range of approximately 45 nm to 70 nm, preferably in the range 45 nm to 60 nm, more preferably about 50 nm, and the phase-shift material is silicon oxynitride having a thickness in the range of approximately 90 nm to 110 nm, preferably about 100 nm.

14. A mask blank for manufacturing of an embedded attenuated phase shift mask according to claim 8.

15. A method of lithographic processing of a device, wherein the method comprises using off-axis illumination and an embedded attenuated phase shift mask according to claim 8.

16. The phase-shift mask of claim 8, wherein the absorber material is chromium or tantalum, and the phase-shift material is silicon oxide or silicon oxynitride.

17. A computer-readable medium having a computer program product stored therein for executing the method according to claim 1.

18. The method of claim 1, wherein the method is performed by one or more computing devices.

19. The method of claim 1, wherein each of the process of performing an aerial image simulation, the process of evaluating the derived image performance parameter value, and the process of adjusting the mask setting values is performed by one or more computing devices.

* * * * *